(12) United States Patent
Tu et al.

(10) Patent No.: US 6,734,526 B1
(45) Date of Patent: May 11, 2004

(54) OXIDATION RESISTANT MICROELECTRONICS CAPACITOR STRUCTURE WITH L SHAPED ISOLATION SPACER

(75) Inventors: Kuo-Chi Tu, Hsin-Chu (TW); Yeur-Luen Tu, Taichung (TW); Tien-Lu Lin, Hsin-chu (TW); Chun-Yao Chen, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/272,648

(22) Filed: Oct. 16, 2002

(51) Int. Cl.⁷ .............................................. H01L 29/00
(52) U.S. Cl. ...................... 257/534; 257/532; 257/535
(58) Field of Search ................. 257/532, 534, 257/535

(56) References Cited

U.S. PATENT DOCUMENTS

| | | | |
|---|---|---|---|
| 5,198,995 A | 3/1993 | Dennard et al. | |
| 6,020,609 A | 2/2000 | Wu | |
| 6,414,344 B1 * | 7/2002 | Kweon | 257/295 |
| 2002/0014646 A1 * | 2/2002 | Tsu et al. | 257/296 |
| 2002/0043677 A1 * | 4/2002 | Jung | 257/295 |
| 2002/0050627 A1 * | 5/2002 | Zambrano | 257/532 |
| 2002/0063271 A1 * | 5/2002 | Kim | 257/295 |
| 2002/0109168 A1 * | 8/2002 | Kim et al. | 257/295 |
| 2002/0142488 A1 * | 10/2002 | Hong | 438/3 |
| 2002/0149041 A1 * | 10/2002 | Lee | 257/295 |
| 2003/0006443 A1 * | 1/2003 | Yang et al. | 257/296 |
| 2003/0006462 A1 * | 1/2003 | Quek et al. | 257/347 |
| 2003/0011011 A1 * | 1/2003 | Basceri et al. | 257/301 |

* cited by examiner

*Primary Examiner*—Ngân V. Ngô

(74) *Attorney, Agent, or Firm*—Tung & Associates

(57) ABSTRACT

A capacitor structure within a microelectronic product employs at least one of: (1) an oxidation barrier layer formed upon a second capacitor plate within the capacitor structure; and (2) a spacer formed adjoining a sidewall of the second capacitor plate, where the spacer is formed with an "L" shape. The foregoing features of the capacitor structure provide a capacitor formed therein with enhanced performance.

9 Claims, 3 Drawing Sheets

US 6,734,526 B1

OXIDATION RESISTANT MICROELECTRONICS CAPACITOR STRUCTURE WITH L SHAPED ISOLATION SPACER

BACKGROUND OF THE INVENTION

1. Field of the Invention

The present invention relates generally to capacitors within microelectronic products. More particularly, the present invention relates to enhanced performance capacitors within microelectronic products.

2. Description of the Related Art

Microelectronic products are formed from microelectronic substrates within and upon which are formed microelectronic devices and over which are formed patterned conductor layers which are separated by dielectric layers.

Common in the microelectronic product fabrication art is the use of capacitors for both data storage functions and data processing functions. While capacitors are generally ubiquitous in the microelectronic product fabrication art, capacitors are nonetheless not entirely without problems.

In that regard, it is often difficult to fabricate within microelectronic products capacitors with enhanced performance.

It is thus towards the foregoing object that the present invention is directed.

Various capacitors having desirable properties have been disclosed in the microelectronic product fabrication art.

Included among the capacitors, but not limited among the capacitors, are capacitors disclosed within: (1) Dennard et al. (U.S. Pat. No. 5,198,995); and Wu (U.S. Pat. No. 6,020,609), both of which are directed towards trench capacitors within dynamic random access memory (DRAM) cells. The teachings of each of the foregoing references are incorporated herein fully by reference.

Desirable in the microelectronic product fabrication art are additional capacitors with enhanced performance.

It is towards the foregoing object that the present invention is directed.

SUMMARY OF THE INVENTION

A first object of the present invention is to provide a capacitor for use within a microelectronic product.

A second object of the invention is to provide a capacitor in accord with the first object of the invention, wherein the capacitor is formed with enhanced performance.

In accord with the objects of the invention, the invention provides a capacitor structure for use within a microelectronic product.

In accord with the invention, the capacitor comprises: (1) a substrate having formed thereover; (2) a first capacitor plate having formed thereupon; (3) a capacitor dielectric layer in turn having formed thereupon; (4) a second capacitor plate. The capacitor also comprises at least one of: (1) an oxidation barrier layer formed upon the second capacitor plate; and (2) a spacer formed adjoining a sidewall of the second capacitor plate, where the spacer is formed with an "L" shape.

The invention provides a capacitor for use within a microelectronic product, wherein the capacitor is formed with enhanced performance. The invention realizes the foregoing object by employing within a capacitor structure at least one of: (1) an oxidation barrier layer formed upon a second capacitor plate within the capacitor structure; and (2) a spacer formed adjoining a sidewall of the second capacitor plate, where the spacer is formed with an "L" shape.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention provides a capacitor for use within a microelectronic product, wherein the capacitor is formed with enhanced performance. The invention realizes the foregoing object by employing within a capacitor structure at least one of: (1) an oxidation barrier layer formed upon a second capacitor plate within the capacitor structure; and (2) a spacer formed adjoining a sidewall of the second capacitor plate, where the spacer is formed with an "L" shape.

First Preferred Embodiment

Figure 1:
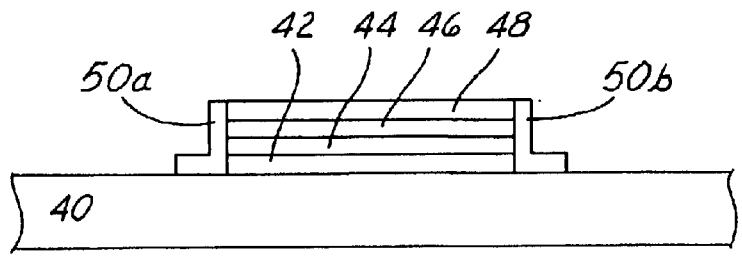
FIG. 1 shows a schematic cross-sectional diagram of a capacitor structure in accord with a general embodiment of the invention which comprises a first preferred embodiment of the invention.

FIG. 1 shows a schematic cross-sectional diagram of a capacitor structure in accord with a general embodiment of the invention which comprises a first preferred embodiment of the invention.

Shown in FIG. 1 is: (1) a substrate 40 having formed thereover; (2) a first capacitor plate layer 42 having formed aligned thereupon; (3) a capacitor dielectric layer 44 having formed aligned thereupon; (4) a second capacitor plate layer 46 in turn having formed aligned thereupon; (5) an oxidation barrier layer 48. Also shown within FIG. 1 is a pair of "L" shaped spacer layers 50a and 50b formed adjoining a pair of opposite edges of the first capacitor plate layer 42, the capacitor dielectric layer 44, the second capacitor plate layer 46 and the oxidation barrier layer 48.

Within the invention, the substrate 40 may be employed within a microelectronic fabrication selected from the group including but not limited to integrated circuit microelectronic fabrications, ceramic substrate microelectronic fabrications and optoelectronic microelectronic fabrications.

Within the invention, each of the first capacitor plate layer 42, the capacitor dielectric layer 44 and the second capacitor plate layer 46 may be formed of materials as are conventional in the microelectronic fabrication art. Although each of the first capacitor plate layer 42 and the second capacitor plate layer 46 may be formed from any of several capacitor plate materials, such as but not limited to metal, metal alloy, doped polysilicon (having a dopant concentration of greater than about 1E20 dopant atoms per cubic centimeter and polycide (doped polysilicon/metal silicide stack) capacitor plate materials, each of the first capacitor plate layer 42 and the second capacitor plate layer 46 is typically formed of a doped polysilicon capacitor plate material formed to a thickness of from about 300 to about 3000 angstroms.

Within the invention, the capacitor dielectric layer 44 may be formed of comparatively lower dielectric constant dielectric materials (having a dielectric constant of from about 4 to about 8), such as but not limited to silicon oxide dielectric materials and silicon nitride dielectric materials. The capacitor dielectric layer 44 may also be formed of comparatively higher dielectric constant dielectric materials (having a dielectric constant of from about 10 to about 200), such as but not limited to tantalum oxide dielectric materials, lead zirconate titanate dielectric materials and barium strontium titanate dielectric materials. Typically, the capacitor dielectric layer 44 is formed to a thickness of from about 30 to about 100 angstroms.

Within the invention, each of the oxidation barrier layer 48 and the pair of "L" shaped spacer layers 50a and 50b serves functionally in providing the capacitor structure of the present invention with enhanced performance.

In that regard, the oxidation barrier layer 48 provides for attenuated oxidation of at least the second capacitor plate layer 46 when exposing the capacitor structure of FIG. 1 to thermal oxidizing environments. In addition, the pair of "L" shaped spacer layers 50a and 50b provide enhanced electrical isolation of the capacitor structure (in particular with respect to the second capacitor plate 46 layer), in comparison with otherwise generally conventional tapered spacer layers.

Although other oxidation barrier materials are not precluded within the invention, the oxidation barrier layer 48 is typically formed of a silicon nitride material or silicon oxynitride material formed to a thickness of from about 50 to about 2000 angstroms. In addition, while other spacer materials are not precluded within the invention, the pair of spacer layers 50a and 50b is typically formed of a silicon nitride material or silicon oxynitride material formed to a conformal thickness of from about 200 to about 500 angstroms.

Second Preferred Embodiment

FIG. 2 to FIG. 10 show a series of schematic plan-view and cross-sectional diagrams illustrating the results of progressive stages of fabricating, in accord with a more specific embodiment of the present invention which comprises a second preferred embodiment of the invention, a capacitor structure within a semiconductor product.

Figure 2:
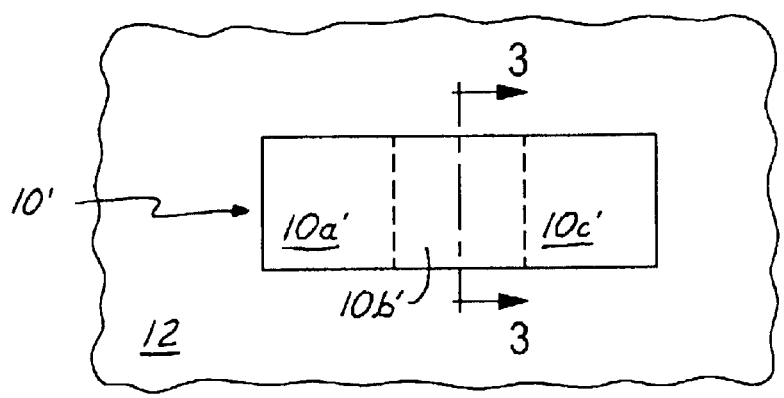
FIG. 2, FIG. 3, FIG. 4, FIG. 5, FIG. 6.

FIG. 2 shows a schematic plan-view diagram of the semiconductor product at an early stage in its fabrication in accord with the second preferred embodiment of the invention.

FIG. 2 shows an active region 10' of a semiconductor substrate surrounded by an isolation region 12. Within FIG. 2, the active region 10' of the semiconductor substrate is further divided into a pair of source/drain areas 10a' and 10c' which are separated by a channel region 10b'. Within the second preferred embodiment, a gate electrode is intended to be formed over the channel region 10b and a pair of source/drain regions is intended to be formed into the pair of source/drain areas 10a' and 10c', thus providing a field effect transistor (FET) device within and upon the active region 10' of the semiconductor substrate.

Figure 3:
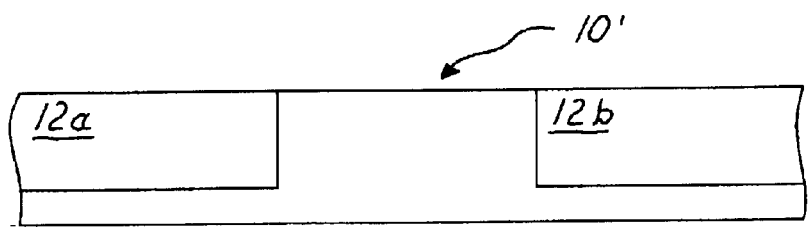

FIG. 3 shows a schematic cross-sectional diagram corresponding with the schematic plan-view diagram of FIG. 2.

FIG. 3 shows the semiconductor substrate 10 having formed therein a pair of isolation regions 12a and 12b (derived from the isolation region 12) which define the active region 10' of the semiconductor substrate 10.

Within the invention, the semiconductor substrate 10 may be formed of any of several semiconductor materials compositions, dopant polarities, dopant concentrations and crystallographic orientations. Typically, the semiconductor substrate 10 is a (100) silicon semiconductor substrate at least in part lightly doped with an appropriate dopant of either dopant polarity.

Within the invention, the pair of isolation regions 12a and 12b may be formed employing any of several methods, including but not limited to local oxidation of silicon (LOCOS) methods and shallow trench isolation (STI) methods. Typically, the pair of isolation regions 12a and 12b is formed as a pair of shallow trench isolation (STI) regions formed at least in part of a silicon oxide dielectric material, as is illustrated within the schematic cross-sectional diagram of FIG. 3.

Figure 4:
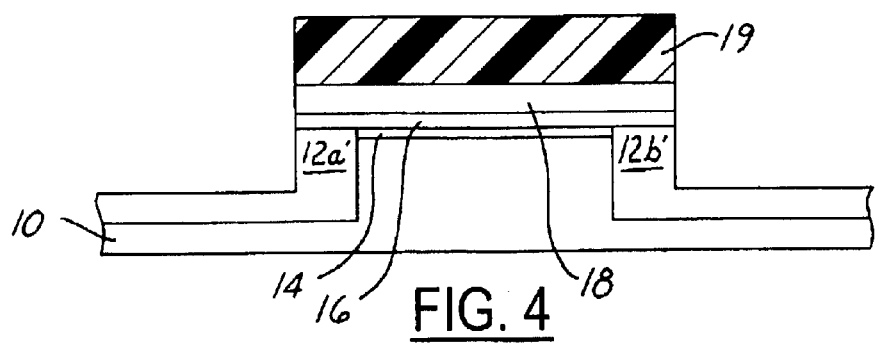

FIG. 4 shows the results of further processing of the semiconductor product of FIG. 3.

FIG. 4 shows the results of forming a pad dielectric layer 14 upon the active region 10' of the semiconductor substrate 10. The pad dielectric layer 14 may be formed of dielectric materials as are conventional or unconventional in the semiconductor product fabrication art. Typically, the pad dielectric layer 14 is formed at least in part of a thermal silicon oxide material formed to a thickness of from about 30 to about 200 angstroms upon the active region 10, of the semiconductor substrate 10.

FIG. 4 also shows a patterned etch stop layer 16 formed upon the pad dielectric layer 14 and spanning over a pair of etched isolation regions 12a' and 12b'. FIG. 4 also shows a patterned capacitor node dielectric layer 18 formed aligned upon the patterned etch stop layer 16. Finally, FIG. 4 illustrates a patterned photoresist layer 19 formed aligned upon the patterned capacitor node dielectric layer 18. Although other materials may be employed for forming each of the patterned etch stop layer 16 and the patterned capacitor node dielectric layer 18: (1) the patterned etch stop layer 16 is typically formed of a silicon nitride material or a silicon oxynitride material formed to a thickness of from about 200 to about 2000 angstroms; and (2) the patterned capacitor node dielectric layer 18 is typically formed of a silicon oxide material formed to a thickness of from about 1000 to about 10000 angstroms. The patterned photoresist layer 19 may be formed of either a positive photoresist material or a negative photoresist material, typically formed to a thickness of from about 10000 to about 70000 angstroms.

As is understood by a person skilled in the art, the patterned photoresist layer 19 is employed for sequentially etching the patterned capacitor node dielectric layer 18 and the patterned etch stop layer 16 from a corresponding blanket capacitor node dielectric layer and blanket etch stop layer, and then etching into the pair of isolation regions 12a and 12b to form the pair of etched isolation regions 12a' and 12b'. Typically, the pair of isolation regions 12a and 12b is etched to a depth of from about 1000 to about 4000 when forming the pair of etched isolation regions 12a' and 12b'.

Figure 5:
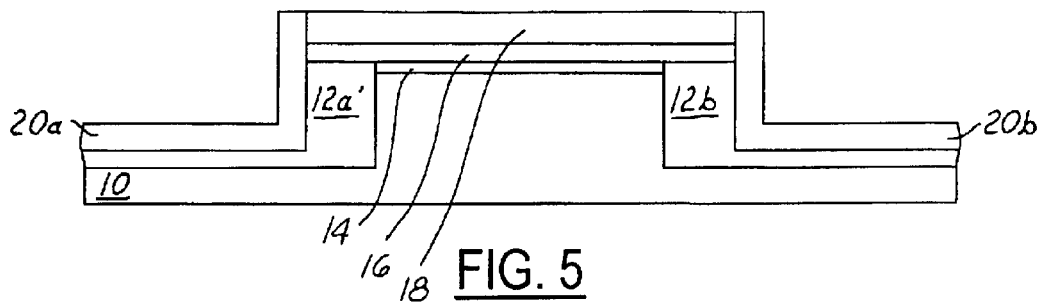

FIG. 5 shows the results of further processing of the semiconductor product of FIG. 4.

FIG. 5 shows the results of stripping the patterned photoresist layer 19 from the patterned capacitor node dielectric layer 18. The patterned photoresist layer 19 may be stripped employing methods and materials as are conventional in the semiconductor product fabrication art.

FIG. 5 also shows a pair of first capacitor plate layers 20*a* and 20*b* (i.e., a pair of capacitor node layers) formed conformally into a pair of apertures defined by the pair of etched isolation regions 12*a*' and 12*b*', the patterned etch stop layer 16 and the patterned capacitor node dielectric layer 18. Thus, the pair of first capacitor plate layers 20*a* and 20*b* is at least partially embedded within the pair of isolation regions 12*a* and 12*b*.

The pair of first capacitor plate layers 20*a* and 20*b* is typically formed incident to planarizing a blanket conformal layer formed of a doped polysilicon material formed to a thickness of from about 700 to about 800 angstroms, although other conductor materials may also be employed. Typically, such planarizing is effected employing a chemical mechanical polishing (CMP) planarizing method, although other planarizing methods may also be employed.

Figure 6:
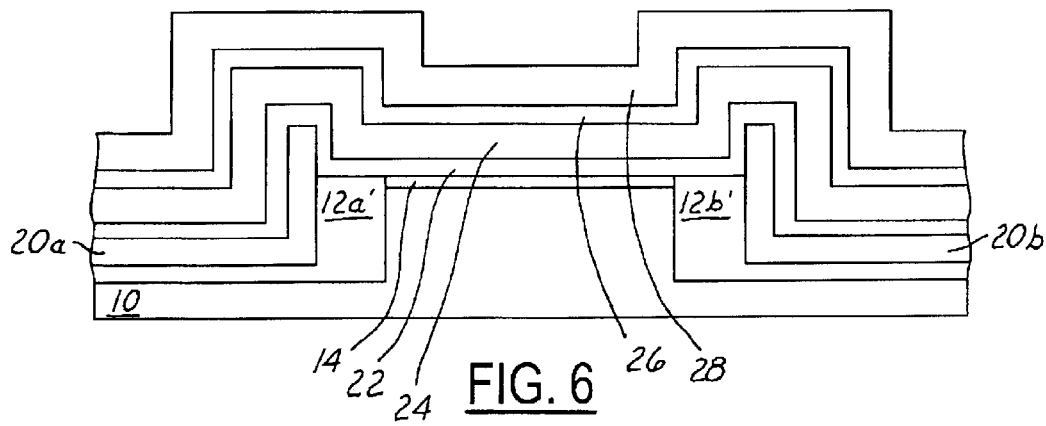

FIG. 6 shows the results of further processing of the semiconductor product of FIG. 5.

FIG. 6 first shows the results stripping from upon or over the pad dielectric layer 14 the patterned etch stop layer 16 and the patterned capacitor node dielectric layer 18. Each of the foregoing two layers may be stripped employing methods and materials as are conventional in the semiconductor product fabrication art.

FIG. 6 also shows the results of forming over the resulting semiconductor product a series of four blanket layers consisting of: (1) a blanket capacitor dielectric layer 22 formed upon the pair of first capacitor plate layers 20*a* and 20*b* and bridging upon the pair of etched isolation regions 12*a*' and 12*b*' and the pad dielectric layer 14; (2) a blanket second capacitor plate layer 24 formed upon the blanket capacitor dielectric layer 22; (3) a blanket oxidation barrier layer 26 formed upon the blanket second capacitor plate layer 24; and (4) a blanket anti-reflective coating (ARC) layer 28 formed upon the blanket oxidation barrier layer 26.

Within the invention, and in accord with the first preferred embodiment of the invention, the blanket capacitor dielectric layer 22 may be formed of a capacitor dielectric material as is conventional or unconventional in the semiconductor product fabrication art. Typically, the blanket capacitor dielectric layer 22 is formed of a capacitor dielectric material having an etch selectivity with respect to the material from which is formed the pad dielectric layer 14, and formed to a thickness of from about 30 to about 100 angstroms.

In addition, and in accord with the first preferred embodiment of the invention, the blanket second capacitor plate layer 24 is typically formed of a doped polysilicon material, formed to a thickness of from about 300 to about 3000 angstroms.

Further, and also in accord with the first preferred embodiment of the invention, the blanket oxidation barrier layer 26 is formed of an oxidation barrier material and in particular a silicon nitride or (comparatively nitrogen rich) silicon oxynitride oxidation barrier material, formed to a thickness of from about 50 to about 500 angstroms.

Finally, the blanket anti-reflective coating layer 28 is formed to a thickness of from about 300 to about 1000 angstroms, typically but not necessarily from a (comparatively nitrogen deficient) silicon oxynitride anti-reflective coating material.

Figure 7:
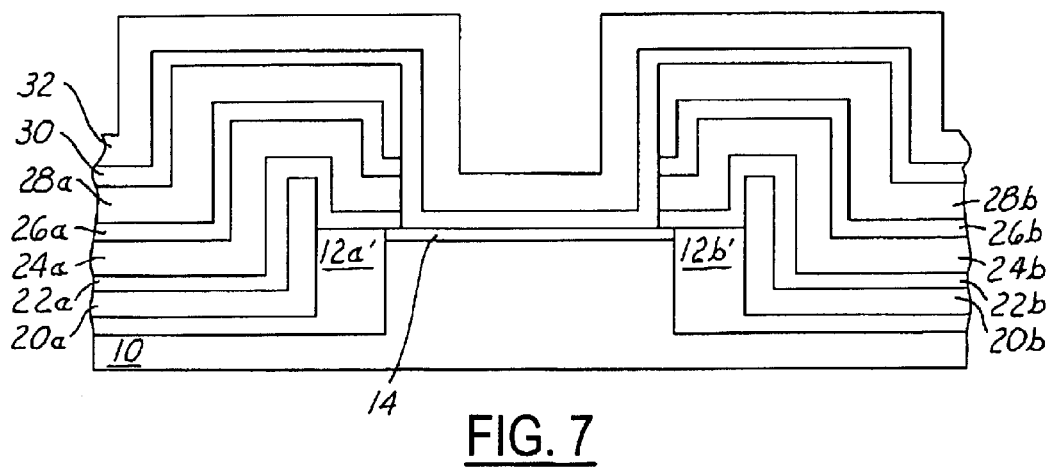
FIG. 7, FIG. 8, FIG. 9 and FIG. 10 show a series of schematic plan-view and cross-sectional diagrams illustrating the results of progressive stages of fabricating a capacitor structure in accord with a more specific embodiment of the invention which comprises a second preferred embodiment of the invention.

FIG. 7 shows the results of further processing of the semiconductor product of FIG. 6.

FIG. 7 shows the results of patterning the blanket anti-reflective coating layer 28, the blanket oxidation barrier layer 26, the blanket second capacitor plate layer 24 and the blanket capacitor dielectric layer 22 to form a corresponding pair of patterned anti-reflective coating layers 28*a* and 28*b*, pair of patterned oxidation barrier layers 26*a* and 26*b*, pair of patterned second capacitor plate layers 24*a* and 24*b* and pair of patterned capacitor dielectric layers 22*a* and 22*b*, while employing the pad dielectric layer 14 as an etch stop layer. Such patterning may be undertaken employing methods as are conventional in the semiconductor product fabrication art, including in particular reactive ion etch methods plasma etch methods. The result of such patterning provides a pair of capacitors within the semiconductor product of FIG. 7, where a pair of patterned second capacitor plate layers within the pair of capacitors extends at least in part above a pair of isolation regions within which the pair of capacitors is otherwise embedded.

FIG. 7 also shows the results of forming a blanket first spacer material layer 30 upon exposed portions of the gate dielectric layer 14, the pair of patterned capacitor dielectric layers 22*a* and 22*b*, the pair of patterned second capacitor plate layers 24*a* and 24*b*, the pair of patterned oxidation barrier layers 26*a* and 26*b* and the pair of patterned anti-reflective coating layers 28*a* and 28*b*. The blanket first spacer material layer 30 in turn has formed thereupon a blanket second spacer material layer 32.

Within the invention, each of the blanket first spacer material layer 30 and the blanket second spacer material layer 32 is formed of a spacer material with etch selectivity with respect to the other. Typically, the blanket first spacer material layer 30 is formed of a silicon nitride or silicon oxynitride spacer material formed to a conformal thickness of from about 200 to about 500 angstroms while the blanket second spacer material layer 32 is formed of a silicon oxide spacer material formed to a conformal thickness of from about 300 to about 1000 angstroms.

Figure 8:
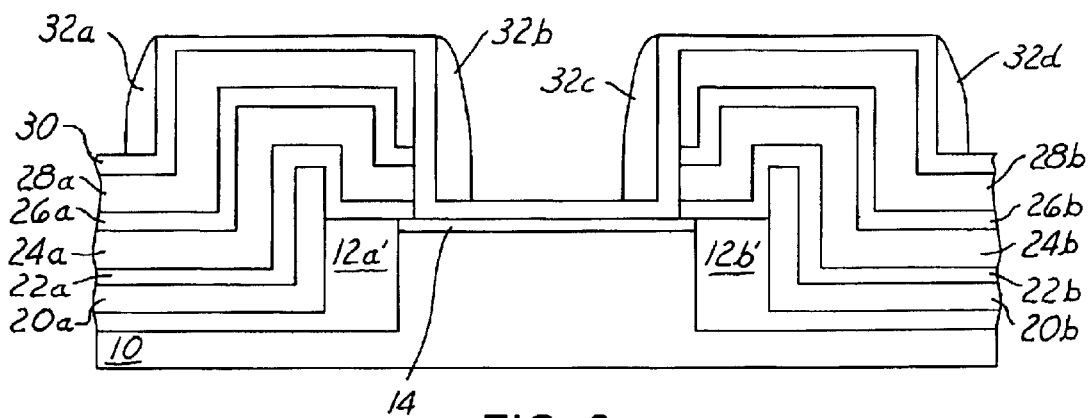

FIG. 8 shows the results of further processing of the semiconductor product of FIG. 7.

FIG. 8 shows the results of anisotropically etching the blanket second spacer material layer 32, while employing the blanket first spacer material layer 30 as an etch stop layer, to form a series of second spacer layers 32*a*, 32*b*, 32*c* and 32*d*. As is illustrated within FIG. 8, each of the series of second spacer layers 32*a*, 32*b*, 32*c* and 32*d* is formed with a tapered profile.

Figure 9:
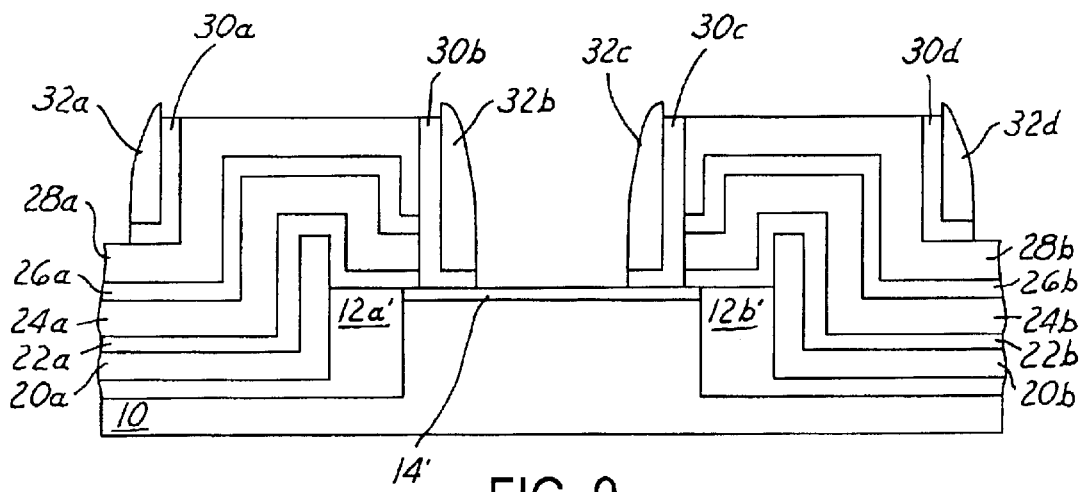

FIG. 9 shows the results of further processing of the semiconductor product of FIG. 8.

FIG. 9 shows the results of etching the blanket first spacer material layer 30, while employing the series of second spacer layers 32*a*, 32*b*, 32*c* and 32*d* as a series of mask layers, to form a series of first spacer layers 30*a*, 30*b*, 30*c* and 30*d*. The blanket second spacer material layer 30 may be etched to form the series of first spacer layers 30*a*, 30*b*, 30*c* and 30*d* while employing etch methods as are convention in the art of semiconductor product fabrication. In particular, when the blanket first spacer material layer 30 is formed of a silicon nitride or silicon oxynitride material and adjacent or adjoining layers are formed of a silicon oxide material, the blanket first spacer material layer 30 may be etched within an aqueous phosphoric acid etchant solution at elevated temperature. As is illustrated within FIG. 8, each of the first spacer layers 30*a*, 30*b*, 30*c* and 30*d*, and in particular the first spacer layer 30*b* and the first spacer layer 30*c*, is formed with an "L" shape. In accord with the first preferred embodiment of the invention, the "L" shape provides for enhanced isolation of the capacitor structure as illustrated within FIG. 9, and in particular the pair of second capacitor plate layers 24*a* and 24*b* within the pair of capacitor structures.

FIG. 9 also shows the results of stripping the pad dielectric layer 14 and reoxidizing the active region of the semiconductor substrate 10 to form a gate dielectric layer 14'. Such stripping and reoxidation will typically provide the gate dielectric layer of silicon oxide of thickness from about 30 to about 100 angstroms.

Figure 10:
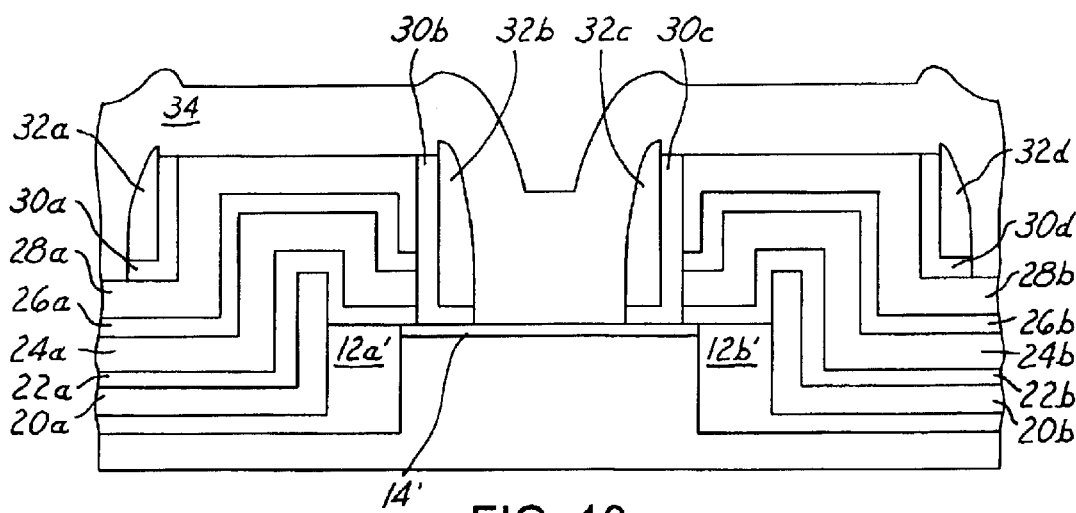

FIG. 10 shows the results of further processing of the semiconductor product of FIG. 9.

FIG. 10 shows a gate electrode 34 formed upon the exposed portion of the gate dielectric layer 14' and spanning over the pair of capacitor structures. The gate electrode may be formed employing methods and materials as are conventional in the semiconductor product fabrication art. Typically, the gate electrode 34 is formed of a doped polysilicon material formed to a thickness of from about 1500 to about 15000 angstroms. Although not specifically illustrated within FIG. 9, the gate electrode 34 is formed such as to cover only the channel region 10b of the active regions of the semiconductor substrate 10 as illustrated within FIG. 1, and a pair of source/drain regions is formed within the source/drain areas 10a and 10c of the active region of the semiconductor substrate 10.

FIG. 10 shows a semiconductor product formed in accord with a second preferred embodiment of the invention. The semiconductor product has formed therein a capacitor structure with enhanced performance. The invention realizes the foregoing object by employing within the capacitor structure at least one of: (1) an oxidation barrier layer formed upon a second capacitor plate within the capacitor structure; and (2) a spacer formed adjoining a sidewall of the second capacitor plate, where the spacer is formed with an "L' shape.

The preferred embodiments of the invention are illustrative of the present invention rather than limiting of the invention. Revisions and modifications may be made to materials, structures and dimensions in accord with a capacitor structure in accord with the preferred embodiment of the invention while still providing a capacitor structure in accord with the present invention, further in accord with the accompanying claims.

What is claimed is:

1. A capacitor structure comprising:
   a substrate;
   a fast capacitor plate formed over the substrate;
   a capacitor dielectric layer formed upon the first capacitor plate;
   a second capacitor plate formed upon the capacitor dielectric layer; and
   an L shaped spacer layer formed adjoining a sidewall of the second capacitor plate.

2. The capacitor structure of claim 1 wherein the substrate is employed within a microelectronic product selected from the group consisting of integrated circuit products, ceramic substrate products, and optoelectronic products.

3. The capacitor structure of claim 1 wherein the L shaped spacer layer has a conformal thickness of from about 200 to about 500 angstroms.

4. A capacitor structure comprising:
   a substrate having formed therein an isolation region;
   a first capacitor plate formed at least in part embedded within the isolation region;
   a capacitor dielectric layer formed upon the first capacitor plate;
   a second capacitor plate formed upon the capacitor dielectric layer and extending at least in part above the isolation region; and
   an L shaped spacer layer formed adjoining a sidewall of the second capacitor plate.

5. The capacitor structure of claim 4 wherein the substrate is employed within a microelectronic product selected from the group consisting of integrated circuit products, ceramic substrate products, and optoelectronic products.

6. The capacitor structure of claim 4 wherein the L shaped spacer layer has a conformal thickness of from about 200 to about 500 angstroms.

7. A capacitor structure comprising:
   a substrate having formed therein an isolation region;
   a first capacitor plate formed embedded at least in part within the isolation region;
   a capacitor dielectric layer formed upon the first capacitor plate;
   a second capacitor plate formed upon the capacitor dielectric layer and extending at least in part above the isolation region; and
   an oxidation barrier layer formed upon the second capacitor plate.

8. The capacitor structure of claim 7 wherein the substrate is employed within a microelectronic product selected from the group consisting of integrated circuit products, ceramic substrate products, and optoelectronic products.

9. The capacitor structure of claim 7 wherein the oxidation barrier layer has a thickness of from about 50 to about 2000 angstroms.

* * * * *